(12) United States Patent
Byeon

(10) Patent No.: US 7,724,583 B2
(45) Date of Patent: May 25, 2010

(54) INTERNAL VOLTAGE GENERATOR AND CONTROL METHOD THEREOF, AND SEMICONDUCTOR MEMORY DEVICE AND SYSTEM INCLUDING THE SAME

(75) Inventor: Dae-Seok Byeon, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 132 days.

(21) Appl. No.: 12/175,494

(22) Filed: Jul. 18, 2008

(65) Prior Publication Data

US 2009/0021985 A1 Jan. 22, 2009

(30) Foreign Application Priority Data

Jul. 19, 2007 (KR) .................. 10-2007-0072314

(51) Int. Cl.
*G11C 16/04* (2006.01)
(52) U.S. Cl. .................. 365/189.09; 365/225.7; 365/226; 365/185.12; 365/185.18
(58) Field of Classification Search ............ 365/189.09, 365/225.7, 226, 185.12, 185.18
See application file for complete search history.

(56) References Cited

U.S. PATENT DOCUMENTS

| 7,227,792 B2 * | 6/2007 | Takahashi et al. ...... 365/189.09 |
| 2002/0089370 A1 | 7/2002 | Shin |

FOREIGN PATENT DOCUMENTS

| JP | 10-289577 | 10/1998 |
| JP | 2004-070805 | 3/2004 |
| KR | 1020060081111 A | 7/2006 |

\* cited by examiner

*Primary Examiner*—David Lam
(74) *Attorney, Agent, or Firm*—Volentine & Whitt, PLLC

(57) ABSTRACT

An internal voltage of a semiconductor memory device is controlled, where the internal voltage is set according to a reference voltage. The reference voltage is controlled according to first control data to increase the internal voltage to be higher than a target voltage in a power-up operation, and second control data is read. The reference voltage is then controlled according to the second control data to decrease the internal voltage to the target voltage.

16 Claims, 6 Drawing Sheets

INTERNAL VOLTAGE GENERATOR AND CONTROL METHOD THEREOF, AND SEMICONDUCTOR MEMORY DEVICE AND SYSTEM INCLUDING THE SAME

PRIORITY CLAIM

A claim of priority under 35 U.S.C. §119 is made to Korean Patent Application No. 10-2007-0072314, filed Jul. 19, 2007, the entire contents of which are hereby incorporated by reference.

SUMMARY

The present invention disclosed herein relates to semiconductor memory devices, and more particularly, to semiconductor memory devices controlling an internal voltage and methods for controlling the same.

Semiconductor memories are usually classified as either random access memories (RAMs) or read only memories (ROMs). RAMs are volatile memory devices that need power supply to retain data. ROMs are nonvolatile memory devices that can retain data without power. Examples of the RAMs include dynamic RAMs (DRAMs) and static RAMs (SRAMs). Examples of the ROMs include programmable ROMs (PROMs), erasable programmable ROMs (EPROMs), electrically erasable programmable ROMs (EEPROMs), and flash memories.

Semiconductor memory devices typically utilize an internal voltage generator which drops an external supply voltage to a predetermined internal voltage. This is done to minimize internal stresses which would otherwise result from the relative high voltage of the external voltage supply.

However, components of the interval voltage generator may deviate from design specifications due to manufacturing variances and the like, which can result inaccurate voltage levels in the internal voltage. Thus, in order to adjust the interval voltage to a desired level, significant time and effort are expended in the selective blowing of a laser fuse circuit to alter the resistive characteristics of the internal voltage generator. See, for example, U.S. Pat. No. 6,255,895 to Kim, et al., issued on Jul. 3, 2001.

Also, see U.S. Pat. No. 6,323,720 to Kim, et al., issued on Nov. 27, 2001.

According to one or more embodiments of the present invention, a method for controlling an internal voltage of a semiconductor memory device is provided, where the internal voltage is set according to a reference voltage. The method includes controlling the reference voltage according to first control data to increase the internal voltage to be higher than a target voltage in a power-up operation, reading second control data, and controlling the reference voltage according to the second control data to decrease the internal voltage to the target voltage.

According to other embodiments of the present invention, a semiconductor memory device is provided which includes a memory cell array configured to store electrical fuse data, a control signal generator circuit configured to generate first control data in a power-up operation, an internal voltage generator circuit configured to generate an internal voltage, a detector circuit configured to detect whether the internal voltage reaches a target voltage, and a control circuit for controlling a page buffer circuit according to a detection results of the detector circuit in order to read the electrical fuse data, and generating second control data according to the electrical fuse data. The internal voltage generator circuit sets the internal voltage to be higher than the target voltage according to the first control data, and sets the internal voltage to the target voltage according to the second control data.

According to other embodiments of the present invention, a memory card is provided which includes a semiconductor memory device, and a memory controller configured to control the semiconductor memory device. The semiconductor memory device is configured to control a reference voltage according to first control data to increase an internal voltage to be higher than a target voltage in a power-up operation, to read second control data, and control the reference voltage according to the second control data to decrease the internal voltage to the target voltage.

According to other embodiments of the present invention, a memory card is provided which includes a semiconductor memory device, and a memory controller configured to control the semiconductor memory device. The semiconductor memory device includes a memory cell array configured to store electrical fuse data, a control signal generator circuit configured to generate first control data in a power-up operation, an internal voltage generator circuit configured to generate an internal voltage, a detector circuit configured to detect whether the internal voltage reaches a target voltage, and a control circuit for controlling a page buffer circuit according to a detection results of the detector circuit in order to read the electrical fuse data, and generating second control data according to the electrical fuse data. The internal voltage generator circuit sets the internal voltage to be higher than the target voltage according to the first control data, and sets the internal voltage to the target voltage according to the second control data.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of embodiments the present invention. In the figures.

DETAILED DESCRIPTION OF EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

Figure 1:
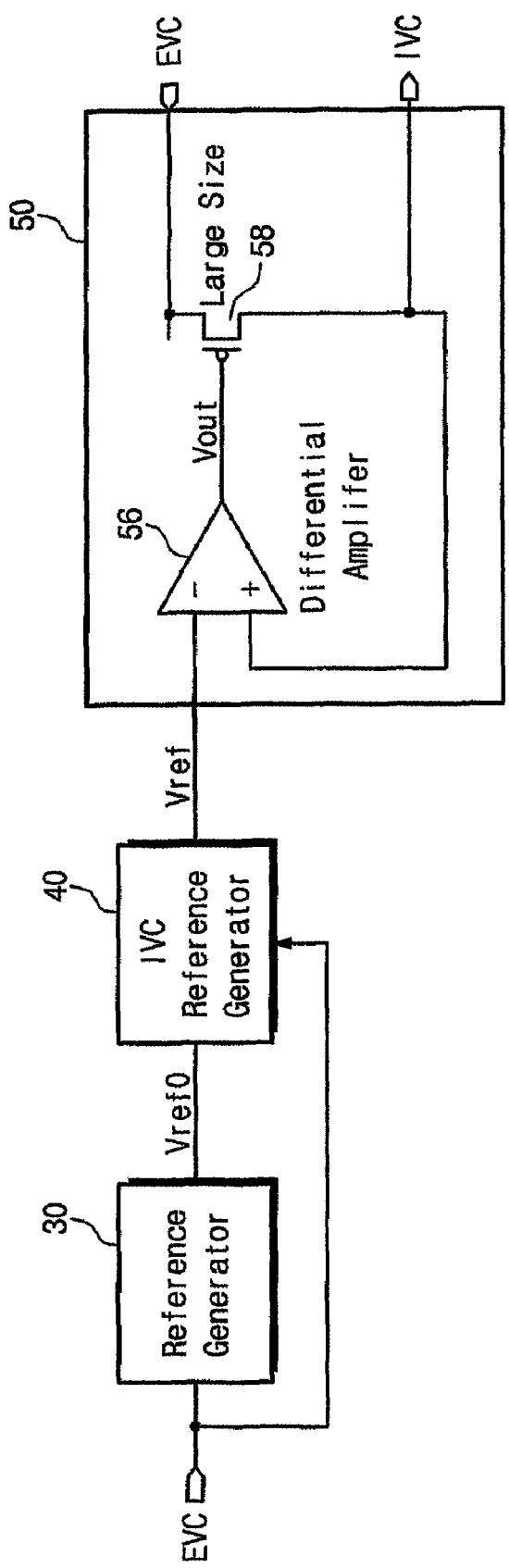
FIG. 1 is a block diagram of an internal voltage generator according to an embodiment of the present invention.

FIG. 1 is a block diagram of an internal voltage generator according to an embodiment of the present invention.

Referring to FIG. 1, the internal voltage generator includes a reference voltage generator 30, an internal reference voltage (IVC reference) generator 40, and an IVC driver 50.

The reference voltage generator 30 receives an external voltage EVC (e.g., about 2.7~3.6 V) and generates a reference voltage Vref0 (e.g., about 1 V). The generated reference voltage Vref0 is transferred to the IVC reference generator 40.

As will be explained by way of an exemplary embodiment later herein, the IVC reference generator 40 generates an internal reference voltage Vref on the basis of the reference voltage Vref0 and the external voltage EVC. A voltage level of the internal reference voltage Vref corresponds to an internal voltage IVC (e.g., about 2.5 V) that is utilized to drive internal circuits of a memory device. The voltage level of the interval voltage IVC depends on a number of factors, including uses and characteristics of the memory device.

The interval voltage driver 50 of this example includes a differential amplifier 56 and a relatively large-sized PMOS transistor 58. A non-inverting input of the differential amplifier 56 is connected to an internal voltage IVC output terminal, and to the PMOS transistor 58. Also, an inverting input of the differential amplifier 56 is connected to receive the internal reference voltage Vref. An output Vout of the differential amplifier 56 is connected to the gate of the PMOS transistor 58, which is connected in series between the external voltage EVC and the internal voltage IVC. Thus, the PMOS transistor 58 is controlled by the output Vout of the differential amplifier 56.

When the external voltage EVC is applied, the internal reference voltage Vref is connected to the IVC driver 50 through the reference voltage generator 30 and the IVC reference generator 40. Since the internal voltage IVC is initially 0 V, the differential amplifier 56 outputs a negative voltage. Therefore, the large-sized PMOS transistor 58 is turned on and the external voltage EVC and the internal voltage IVC are connected through a channel. Therefore, the external voltage EVC increases and thus the internal voltage IVC increases. When the internal voltage IVC reaches the voltage level of the internal reference voltage Vref, it stops increasing and maintains a constant voltage level.

Herein, as the applied external voltage EVC starts to increase, the reference voltage Vref0 increases up to a predetermined level. Based on the reference voltage Vref0 and the external voltage EVC, the internal reference voltage Vref increases up to a predetermined level. However, by means of the IVC driver 50, the internal voltage IVC is designed to have the same level as the internal reference voltage Vref. Therefore, the internal voltage IVC increases while the internal reference voltage Vref increases up to the predetermined level.

Figure 2:
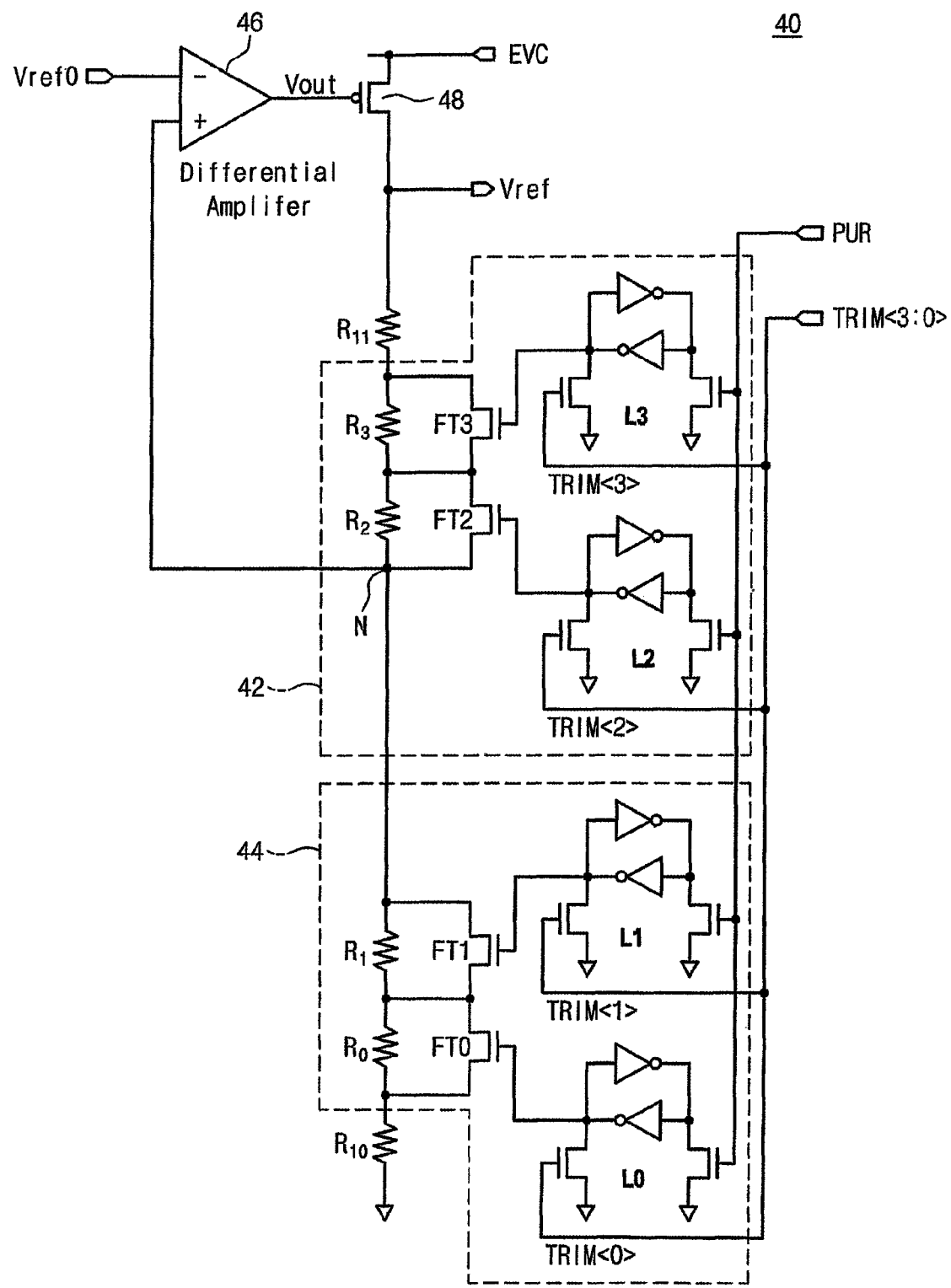
FIG. 2 is a circuit diagram of an internal voltage reference generator of the internal voltage generator illustrated in FIG. 1 according to an embodiment of the present invention.

FIG. 2 is a circuit diagram of the IVC reference generator 40 illustrated in FIG. 1 according to an embodiment of the present invention.

Referring to FIG. 2, the IVC reference generator 40 includes a differential amplifier 46, a PMOS transistor 48, an up-trim circuit 42, a down-trim circuit 44, and resistors R10 and R11.

A non-inverting input of the differential amplifier 46 is connected to a node N between the up-trim circuit 42 and the down-trim circuit 44. An inverting input of the differential amplifier 46 is connected to the reference voltage Vref0. An output Vout of the differential amplifier 46 is connected to the PMOS transistor 48.

The PMOS transistor 48 is connected to the differential amplifier 46, the external voltage EVC, and the internal reference voltage Vref, and is connected to the up-trim circuit 42 through the resistor R11. The internal reference voltage Vref has the same voltage level as the internal voltage IVC. The PMOS transistor 48 is controlled by the output Vout of the differential amplifier 46.

The up-trim 42 circuit is connected to the down-trim circuit 44 and the non-inverting input of the differential amplifier 46, and is connected to the PMOS transistor 48 through the resistor R11. The up-trim 42 circuit includes resistors R2 and R3 and an electrical fuse circuit.

The electrical fuse circuit includes first and second latch circuits L2 and L3, and fuse transistors FT2 and FT3 as shown in FIG. 2. The fuse transistors FT2 and FT3 are connected in parallel to the resistors R2 and R3, and their gates are connected to the respective latch circuits L2 and L3. When the fuse transistors FT2 and FT3 are turned on, the resistors R2 and R3 are by-passed and not applied to the circuit. On the other hand, when the fuse transistors FT2 and FT3 are turned off, the resistors R2 and R3 not by-passed and are applied to the circuit. The fuse transistors FT2 and FT2 are gated to the latch circuits L2 and L3, respectively, and thus the resistors R2 and R3 are selectively by-passed based on data stored in the latch circuits L2 and L3, respectively.

A power-up reset signal PUR and control signals TRIM<2> and TRIM<3> are applied to the latch circuits L2 and L3, respectively. When the power-up reset signal PUR is HIGH, the fuse transistors FT2 and FT3 are both turned on. Therefore, the resistors R2 and R3 are not applied to the circuit. On the other hand, when the control signal TRIM<2> is HIGH, the fuse transistor FT2 is off, and when the control signal TRIM<3> is HIGH, the fuse transistor FT3 is turned off.

The down-trim circuit 44 is connected to the up-trim circuit 42 and the non-inverting input of the differential amplifier 46, and is connected to a ground voltage through the resistor R10. The down-trim circuit 44 includes resistors R0 and R1 and an electrical fuse circuit.

The electrical fuse circuit of the down-trim 44 includes latch circuits L0 and L1, and fuse transistors FT0 and FT1. The power-up reset signal PUR and control signals TRIM<0> and TRIM<1> are applied to the latch circuits L0 and L1 of the down-trim circuit 44 as shown in FIG. 2.

A voltage of the node N increases up to the voltage level of the reference voltage Vref0. Further, since the voltage of the node N is voltage-divided relative to the internal reference voltage Vref, the voltage of the node N is lower than the internal reference voltage Vref. Since the voltage of the node N has reached the reference voltage Vref0, the internal reference voltage Vref is higher than the reference voltage Vref0. That is, it can be said that the internal reference voltage Vref is converted from the reference voltage Vref0.

The conversion ratio is determined according to the node N. More particularly, the conversion ratio is the ratio of (a) the total non-bypassed resistance of the resistors R10, R0 and R1 to (b) the total non-bypassed resistance of the resistors R2, R3 and R11. When the total non-bypassed resistance of the resistors R2, R3 and R11 increases, the conversion ratio of the internal reference voltage Vref decreases. In the example of this embodiment, when the fuse transistors FT2 and FT3 of the up-trim circuit 42 are turned off, the resistors R2 and R3 are not bypassed, and the internal reference voltage Vref decreases.

In contrast, when the total non-bypassed resistance of the resistors R10, R0 and R1 increases, the conversion ratio of the internal reference voltage Vref increases. That is, when the fuse transistors FT0 and FT1 of the down-trim circuit 44 are turned off, the resistors R0 and R1 are not bypassed, and the internal reference voltage Vref increases.

In this manner, the up-trim circuit 42 and the down-trim circuit 44 are responsive to the power-up reset signal PUR and the control signals TRIM<3:0> to control the internal reference voltage Vref.

In operation, when the power-up reset signal PUR is applied to the electrical fuse circuits, all the latches L3~L0 are initialized. Therefore, the fuse transistors FT0~FT3 are all turned on, and the resistors R0~R3 are all bypassed. Thus, the internal reference voltage Vref is generated according to the ratio between the resistors R10 and R11.

At this point, in the case where resistances of the resistors R10 and R11 do not exactly match design resistance, the internal reference voltage Vref fails to reach the designed voltage level. Therefore, the internal voltage IVC also fails to reach the designed voltage level. Herein, when the internal voltage IVC is lower than a detection voltage $V_{DCT}$, a power-up read is not performed and the internal voltage IV C is not controlled. To overcome this potential problem, the electrical fuse circuits are separately controlled after the power-up reset (PUR) so that the internal voltage IVC reaches a higher voltage level than the detection voltage $V_{DCT}$.

The control signals applied to the electrical fuses control the electrical fuses so that the internal voltage IVC is higher than the detection voltage $V_{DCT}$. For example, when '1000' is transferred as the control signal TRIM<3:0> after the power-up reset (PUR), the fuse transistor FT0 is turned off and the remaining fuse transistors FT1~FT3 maintain turned-on. Since the resistance of the down-trim 44 has increased, the internal reference voltage Vref increases. That is, the internal voltage IVC reaches a higher voltage than the internal voltage IVC of the power-up reset (PUR) state.

A control signal for controlling the electrical fuse after the power-up reset (PUR) is generated before the internal voltage IVC reaches a target voltage $V_{TAR}$. Therefore, the control signal is generated by a logic circuit or a control signal generator physically implemented in the memory device so that the control signal can be generated by the voltage level of the power-up reset signal PUR.

The power-up read is performed when the electrical fuse circuits are controlled so that the internal voltage IVC is certainly higher than the detection voltage $V_{DCT}$. Also, the internal voltage IVC is controlled to have the same level as the target voltage $V_{TAR}$. Hereinafter, the control signal for controlling the electrical fuse circuits after the power-up reset (PUR) will be referred to as a first control signal TRIM1, and a control signal for controlling the electrical fuse circuits after the data read from a memory cell array will be referred to as a second control signal TRIM2.

Figure 3:
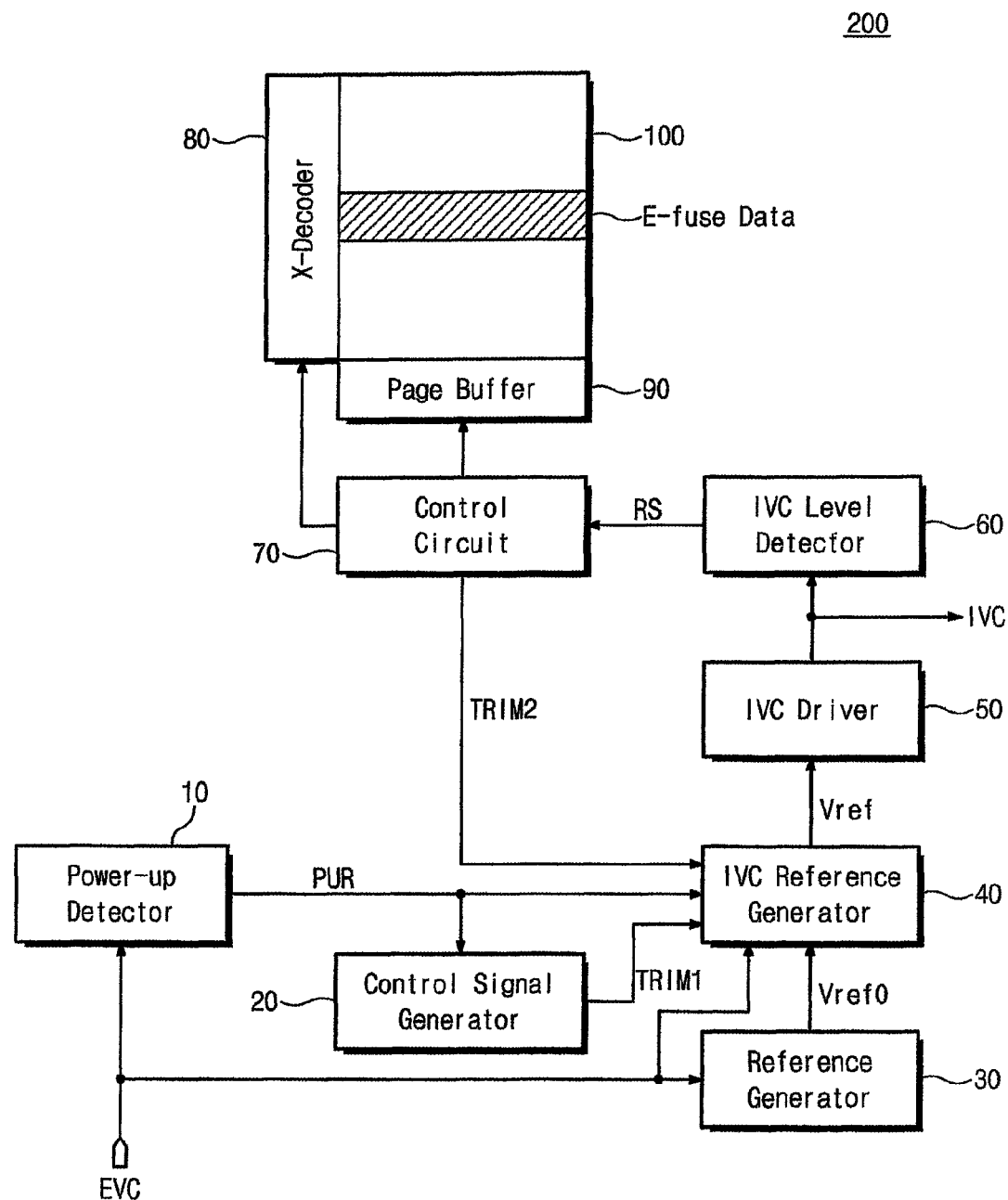
FIG. 3 is a block diagram of a semiconductor memory device according to an embodiment of the present invention.

FIG. 3 is a block diagram of a semiconductor memory device according to an embodiment of the present invention.

Referring to FIG. 3, a semiconductor memory device 200 includes a power-up detector 10, a control signal generator 20, a reference generator 30, an internal voltage (IVC) reference generator 40, an IVC driver 50, an IVC level detector 60, a control circuit 70, a row decoder (X-decoder) 80, a page buffer 90, and a cell array 100.

The power-up detector 10 is connected to an external voltage EVC, the control signal generator 20, and the IVC reference generator 40. When the external voltage EVC reaches an initialization voltage $V_{INI}$, the power-up detector 10 generates a power-up reset signal PUR. The power-up reset signal PUR is transferred to the control signal generator 20 and the IVC reference generator 40.

The control signal generator 20 is connected to the power-up detector 10 and the IVC reference generator 40. The control signal generator 20 generates a first control signal TRIM1. The control signal generator 20 receives the power-up reset signal PUR from the power-up detector 10 and transfers the first control signal TRIM1 to the IVC reference generator 40.

The reference generator 30 is connected to the external voltage EVC and the IVC reference generator 40. The reference generator 30 receives the external voltage EVC to generate a reference voltage Vref0. The reference voltage Vref0 is transferred to the IVC reference generator 40.

The IVC reference generator 40 is connected to the power-up detector 10, the control signal generator 20, the reference generator 30, the IVC driver 50, the control circuit 70, and the external voltage EVC. When the power-up reset signal PUR is received from the power-up detector 10, the latch circuits of the IVC reference generator 40 are reset. When the first control signal TRIM1 is received from the control signal generator 20 or when a second control signal TRIM2 is received from the control circuit 70, the opening of an electrical fuse circuit is controlled. On the basis of the controlled electrical fuse circuit, the IVC reference generator 40 converts the reference voltage Vref0 into an internal reference voltage Vref. The internal reference voltage Vref is transferred to the IVC driver 50.

The IVC driver 50 is connected to the IVC reference generator 40, an internal voltage IVC, and the IVC level detector 60. When the internal reference voltage Vref is received from the IVC reference generator 40, the IVC driver 50 generates an internal voltage IVC having the same level as the internal reference voltage Vref. The internal voltage IVC is provided to the memory device and also is transferred to the IVC level detector 60.

The IVC level detector 60 is connected to the IVC driver 50, the internal voltage IVC, and the control circuit 70. When the internal voltage IVC received from the IVC driver 50 reaches a detection voltage $V_{DCT}$, the IVC level detector 60 generates a read signal RS. The read signal RS is transferred to the control circuit 70.

The control circuit 70 is connected to the IVC reference generator 40, the IVC level detector 60, the row decoder 80, and the page buffer 90. When the read signal RS is received from the IVC level detector 60, the control circuit 70 controls the row decoder 80 and the page buffer 90 to perform a read operation.

When the control circuit 70 selects a column of the cell array 100 through the pager buffer 90 and the row decoder 80 selects a row of the cell array 100, data (i.e., E-fuse data) stored in the cell array 100 are read through the pager buffer 90. The control circuit 70 generates the second control signal TRIM2 on the basis of the read data. The generated second control signal TRIM2 is transferred to the IVC reference generator 40. Also, the control circuit 70 controls the components of the semiconductor memory device 200.

The row decoder 80 is connected to the control circuit 70 and the cell array 100. Under the control of the control circuit 70, the row decoder 80 selects a row of the cell array 100. The page buffer 90 is connected to the control circuit 70 and the cell array 100. Under the control of the control circuit 70, the page buffer 90 temporarily stores data read from the cell array 100. Also, the pager buffer 90 temporarily stores data to be written in the cell array 100.

The cell array 100 is connected to the row decoder 80 and the pager buffer 90. When a row of the cell array 100 is selected by the row decoder 180 and a column of the cell array 100 is selected through the page buffer 90, data of a selected memory cell are transferred to the page buffer 90. A plurality of memory cells are arranged in the cell array 100, and electrical fuse control data (E-fuse data) are stored in the cell array 100.

The electrical fuse control data (E-fuse data) are used to generate the second control signal TRIM2. The electrical fuse control data (E-fuse data) are present in the memory device even before a supply voltage is applied to the memory device. In other words, the electrical fuse control data (E-fuse data) are stored in a nonvolatile memory device or are determined by one or more logic circuits. When the memory device is a nonvolatile memory device (e.g., a flash memory device), the electrical fuse control data (E-fuse data) may be stored in a memory cell array. According to the present embodiment of the present invention, the electrical fuse control data (E-fuse data) are stored in the cell array 100.

Figure 4:
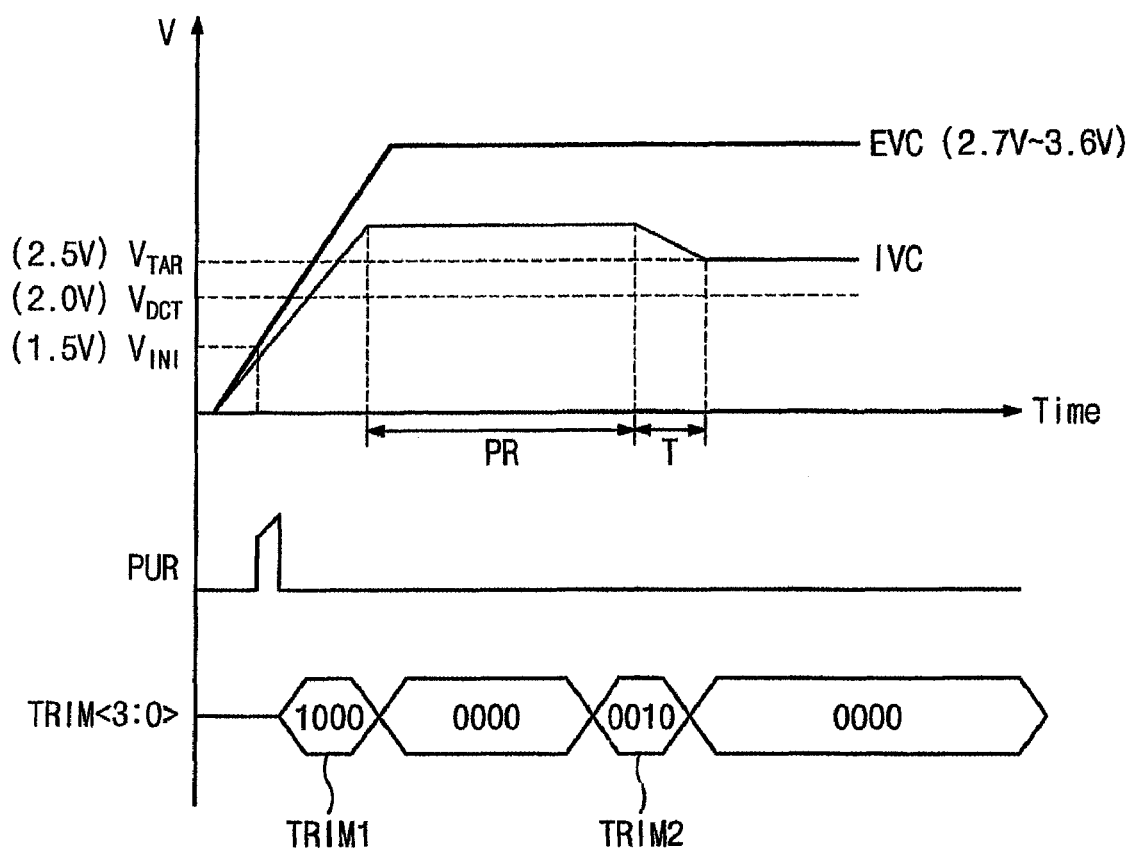
FIG. 4 is a diagram illustrating a process for controlling an internal voltage according to an embodiment of the present invention.

FIG. 4 is a timing diagram illustrating a process for controlling the internal voltage in the semiconductor memory device 200 of FIG. 3 according to an embodiment of the present invention.

Referring to FIG. 4, the internal voltage IVC is controlled on the basis of the initialization voltage $V_{INI}$, the detection voltage $V_{DCT}$, and the target voltage $V_{TAR}$. In this example, the external voltage EVC is about 2.7~3.6 V.

The initialization voltage $V_{INI}$ (e.g., about 1.5 V) is related to the external voltage EVC. When the external voltage EVC reaches the initialization voltage $V_{INI}$, a power-up reset is performed to reset the storage units (e.g., the latches), except for the memory cell array in the memory device.

The detection voltage $V_{DCT}$ (e.g., about 2 V) is related to the internal voltage IVC. When the level of the internal voltage IVC reaches the level of the detection voltage $V_{DCT}$, a power-up read (PR) is performed to read the electrical fuse control data (E-fuse data) stored in the memory cell array. The electrical fuse control data (E-fuse data) read from the memory cell array is used to control the electrical fuse circuits so that the internal voltage IVC reaches the target voltage $V_{TAR}$. The target voltage $V_{TAR}$ (e.g., about 2.5 V) is the level of the internal voltage IVC required in the memory device.

FIG. 4 illustrates time-dependent changes in the external voltage EVC, the internal voltage IVC, the power-up reset signal PUR, and the control signal TRIM<3:0>. Herein, the first control signal TRIM1 is used to control the electrical fuse circuit so that the internal voltage IVC becomes higher than the detection voltage $V_{DCT}$ after the power-up reset (PUR). The second control signal TRIM2 is used to control the electrical fuse circuits so that the internal voltage IVC reaches the target voltage $V_{TAR}$.

Hereinafter, the IVC control process according to an embodiment of the present invention will be described with reference to FIGS. 3 and 4.

When the external voltage EVC is supplied to the memory device 200, the external voltage EVC is applied to the power-up detector 10 and the reference generator 30. When the external voltage EVC is applied, the reference generator 30 generates the reference voltage Vref0. The IVC reference generator 40 receives the reference voltage Vref0 from the reference generator 30 to generate the internal reference voltage Vref.

The IVC deriver 50 receives the internal reference voltage Vref from the IVC reference generator 40 to generate the internal voltage IVC having the same level as the internal reference voltage Vref. Therefore, the internal voltage IVC also increases as the external voltage EVC increases.

When the external voltage EVC reaches the initialization voltage $V_{INI}$, the power-up detector 10 generates the power-up reset signal PUR. The power-up reset signal PUR resets all the storage units in the memory device 200. Accordingly, the latch circuits in the IVC reference generator 40 are also reset. Therefore, the electrical fuses FT0~FT3 of the electrical fuses are all turned on and all the resistors connected to the electrical fuses are bypassed.

The control signal generator 20 receives the power-up reset signal PUR and waits until the power-up reset signal PUR is deactivated. When the power-up reset signal PUR is deactivated, the control signal generator 20 generates the first control signal TRIM1 and transfers the same to the IVC reference generator 40. The first control signal TRIM1 is used to control the electrical fuse circuits so that the internal reference voltage Vref reliably reaches a higher voltage level than the detection voltage $V_{DCT}$.

For example, the first control signal TRIM1 may be set to '1000'. In this case, in the IVC reference generator 40, the fuse transistor FT0 is turned off and the remaining fuse transistors FT1~FT3 maintain turn-on. Since the total non-bypassed resistance of the resistors R0 and R1 of the down-trim circuit 44 has increased, the internal reference voltage Vref becomes higher than the internal reference voltage Vref of the power-up reset (PUR) state.

When the control of the electrical fuse is completed, the first control signal TRIM1 is deactivated. The first control signal TRIM1 may be deactivated by applying a control signal '0000' or by applying no signal. When '0000' is applied as the control signal, the control signal '0000' is generated by a separate logic (not illustrated).

The IVC driver 50 generates the internal voltage IVC having the same level as the internal reference voltage Vref. Therefore, the internal voltage IVC reliably reaches a higher level than the detection voltage $V_{DCT}$. The internal voltage IVC reaches the detection voltage $V_{DCT}$, a power-up read (PR) is performed for a PR period.

First, the IVC level detector 60 generates the read signal RS. The generated read signal RS is transferred to the control circuit 70. The control circuit 70 receives the read signal RS and reads the electrical fuse control data (E-fuse data) from the cell array 100. Upon completion of the read operation, the control circuit 70 generates the second control signal TRIM2 on the basis of the electrical fuse control data (E-fuse data). The generated second control signal TRIM2 is transferred to the IVC reference generator 40.

Then, the internal voltage IVC is controlled for a period T. The second control signal TRIM2 is used to control the internal reference voltage Vref to have the same level as the target voltage $V_{TAR}$. For example, the second control signal TRIM2 may be set to '0010'. The IVC reference generator 40 receives the second control signal TRIM2 to control the opening of the electrical fuse circuits. When the control operation is completed, the internal voltage IVC maintains the same voltage as the target voltage $V_{TAR}$. Thereafter, the second control signal TRIM2 is deactivated. The second control signal TRIM2 may be deactivated by applying a control signal '0000' or by applying no signal. When '0000' is applied as the control signal, the control signal '0000' is generated by a separate logic (not illustrated).

As described above, the present invention applies the first control signal TRIM1 to the internal voltage generator, thereby controlling the internal voltage IVC to be higher than the detection voltage $V_{DCT}$. Therefore, even when the internal voltage IVC fails to reach the designed voltage level, the power-up read (PR) is reliably performed. That is, the internal voltage IVC is controlled to have the level of the target voltage $V_{TAR}$, and thus the memory device operates normally.

Figure 5:
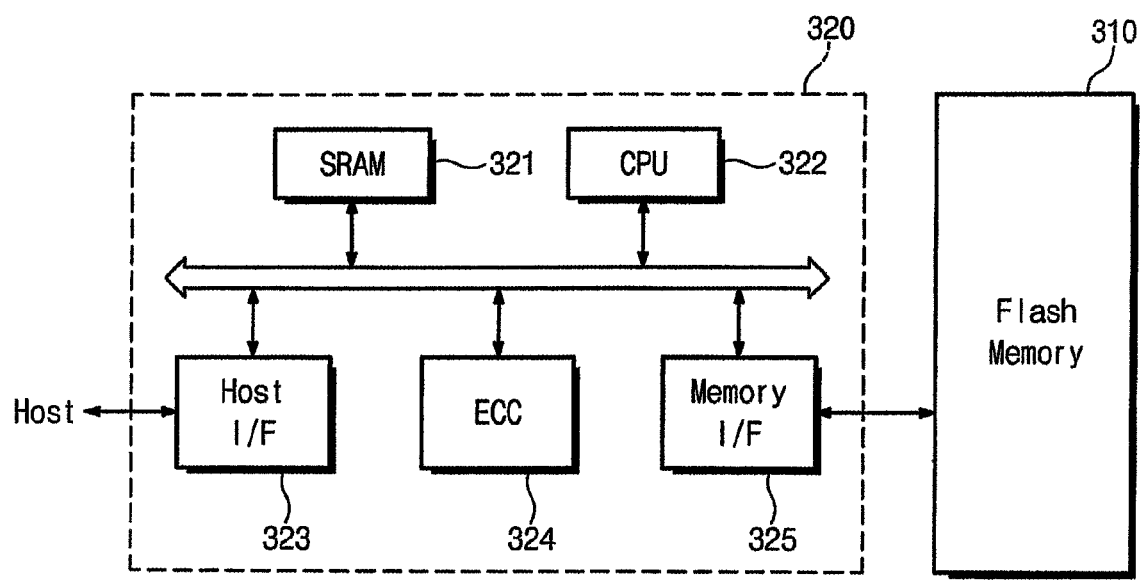
FIG. 5 is a block diagram of a memory card having a NAND flash memory device according to an embodiment of the present invention.

FIG. 5 is a block diagram of a memory card having a flash memory device according to an embodiment of the present invention.

Referring to FIG. 5, for high-capacity data storage, a memory card 300 is mounted with a flash memory device 310 according to the present invention. The memory card 300 includes a memory controller 320 for controlling an exchange of related data between a host and the flash memory device 310.

An SRAM 321 is used as an operating memory of a processing unit (e.g., CPU) 322. A host interface (I/F) 323 has a data exchange protocol for the host connected to the memory card 300. An error correction block 324 detects and corrects an error in data that are read from the multi-bit flash memory device 310. A memory interface 325 interfaces with the flash memory device 310.

The processing unit 322 performs control operations for data exchange of the memory controller 320. Although not illustrated in FIG. 5, those skilled is the art that will readily understand that the memory card 300 may further include a ROM storing code data for an interface with the host.

Figure 6:
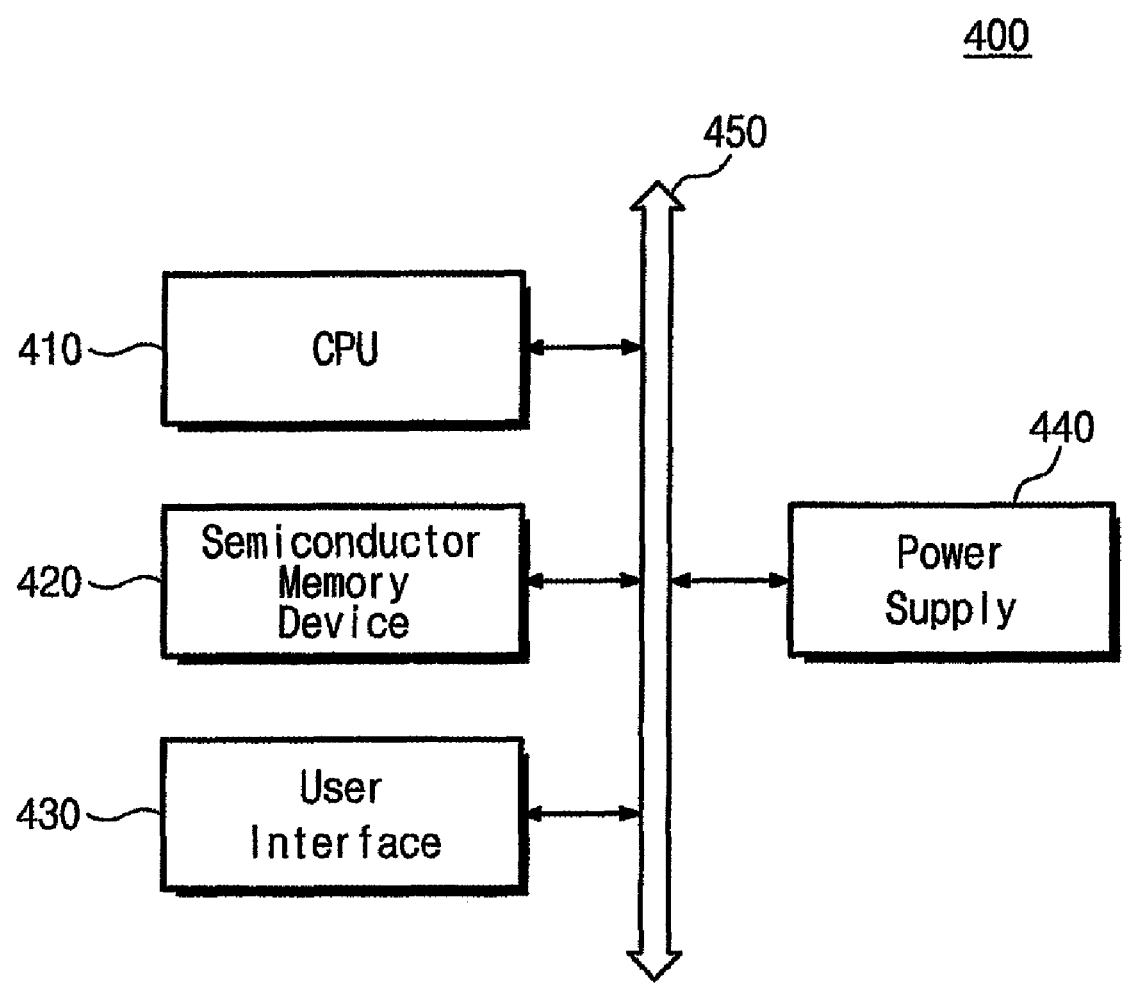
FIG. 6 is a block diagram of a memory system including a NAND flash memory device according to an embodiment of the present invention.

FIG. 6 is a block diagram of a memory system including a semiconductor memory device according to an embodiment of the present invention.

Referring to FIG. 6, a memory system 400 includes a semiconductor memory device 420, a power supply 440, a central processing unit (CPU) 410, a user interface 430, and a system bus 450.

The semiconductor memory device 420 is electrically connected to the power supply 440, the CPU 410, and the user interface 430 through the system bus 450. Data, which are provided through the user interface 430 or processed by the CPU 410, are stored in the semiconductor memory device 420.

The embodiment of the present invention exemplifies the case of controlling the electrical fuse circuits of the IVC reference generator. However, the internal voltage generator can be applied in various structures. Also, the embodiment of the present invention exemplifies the case of storing the electrical fuse control signal (E-fuse data) in the cell array. However, in the case of a volatile memory device, the control data may be nonvolatilely stored in the memory device or the control signals may be generated by logics.

According to the present invention as described above, the internal voltage IVC becomes higher than the detection voltage $V_{DCT}$ even when the internal voltage IVC fails to have a designed value. Therefore, the power-up read can be reliably performed, and a more stable and accurate internal voltage can be generated.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method for controlling an internal voltage of a semiconductor memory device, wherein the internal voltage is set according to a reference voltage, said method comprising:
controlling the reference voltage according to first control data to increase the internal voltage to be higher than a target voltage in a power-up operation;
reading second control data; and
controlling the reference voltage according to the second control data to decrease the internal voltage to the target voltage.

2. The method of claim 1, wherein the second control data is read when the internal voltage reaches the target voltage.

3. The method of claim 1, wherein the first control data is stored in a nonvolatile memory.

4. The method of claim 1, wherein the second control data is stored in a memory cell array of the semiconductor memory device.

5. The method of claim 4, wherein the semiconductor memory device is a nonvolatile memory device.

6. The method of claim 1, wherein the reference voltage has a same voltage level as the internal voltage.

7. The method of claim 1, wherein the first control data and the second control data are each used to control resistances of a voltage dividing circuit for dividing the reference voltage.

8. A semiconductor memory device comprising:
a memory cell array configured to store electrical fuse data;
a control signal generator circuit configured to generate first control data in a power-up operation;
an internal voltage generator circuit configured to generate an internal voltage;
a detector circuit configured to detect whether the internal voltage reaches a target voltage; and
a control circuit for controlling a page buffer circuit according to a detection results of the detector circuit in order to read the electrical fuse data, and generating second control data according to the electrical fuse data,
wherein the internal voltage generator circuit sets the internal voltage to be higher than the target voltage according to the first control data, and sets the internal voltage to the target voltage according to the second control data.

9. The semiconductor memory device of claim 8, wherein the internal voltage generator circuit comprises:
a reference generator configured to generate a reference voltage which varies according to the first control data and the second control data; and
an internal voltage driver configured to output the internal voltage having a same voltage level as the reference voltage.

10. The semiconductor memory device of claim 9, wherein the reference voltage is controlled by the first control data so that the internal voltage is set to be higher than the target voltage, and the reference voltage is controlled by the second control data so that the internal voltage is set to the target voltage.

11. The semiconductor memory device of claim 8, wherein the semiconductor memory device is a nonvolatile memory device.

12. The semiconductor memory device of claim 8, wherein the control voltage generator circuit comprises a nonvolatile storage unit for storing the first control data.

13. A memory system comprising a semiconductor memory device, and a memory controller configured to control the semiconductor memory device,
wherein the semiconductor memory device is configured to control a reference voltage according to first control data to increase an internal voltage to be higher than a target voltage in a power-up operation, to read second control data, and control the reference voltage according to the second control data to decrease the internal voltage to the target voltage.

14. The memory system of claim 13, wherein the semiconductor memory device and the memory controller are contained in a memory card.

15. A memory system comprising a semiconductor memory device, and a memory controller configured to control the semiconductor memory device, wherein the semiconductor memory device comprises:
- a memory cell array configured to store electrical fuse data;
- a control signal generator circuit configured to generate first control data in a power-up operation;
- an internal voltage generator circuit configured to generate an internal voltage;
- a detector circuit configured to detect whether the internal voltage reaches a target voltage; and
- a control circuit for controlling a page buffer circuit according to a detection results of the detector circuit in order to read the electrical fuse data, and generating second control data according to the electrical fuse data, wherein the internal voltage generator circuit sets the internal voltage to be higher than the target voltage according to the first control data, and sets the internal voltage to the target voltage according to the second control data.

16. The memory system of claim 15, wherein the semiconductor memory device and the memory controller are contained in a memory card.

* * * * *